(12) United States Patent
Ziegler et al.

(10) Patent No.: US 9,645,388 B2
(45) Date of Patent: May 9, 2017

(54) FACET MIRROR DEVICE

(71) Applicant: Carl Zeiss SMT GmbH, Oberkochen (DE)

(72) Inventors: Gerhard-Wilhelm Ziegler, Aalen (DE); Thomas Bischoff, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 188 days.

(21) Appl. No.: 14/047,192

(22) Filed: Oct. 7, 2013

(65) Prior Publication Data

US 2014/0022658 A1    Jan. 23, 2014

Related U.S. Application Data

(63) Continuation of application No. PCT/EP2011/055938, filed on Apr. 14, 2011.

(51) Int. Cl.
*G02B 26/08* (2006.01)
*G02B 7/182* (2006.01)
*G03F 7/20* (2006.01)

(52) U.S. Cl.
CPC ....... *G02B 26/0816* (2013.01); *G02B 7/1822* (2013.01); *G02B 26/0833* (2013.01); *G03F 7/70058* (2013.01); *Y10T 29/49826* (2015.01)

(58) Field of Classification Search
CPC .. G02B 26/0816; G02B 7/182; G02B 7/1822; G02B 26/0833; G02B 7/185; G02B 7/1824; G02B 7/1827; G02B 7/1825; G03F 7/70058; Y10T 29/49826

USPC .... 359/224.1, 845, 846, 849, 872, 851, 853; 355/66, 77

See application file for complete search history.

(56) References Cited

U.S. PATENT DOCUMENTS

| | | | | |
|---|---|---|---|---|
| 5,162,951 | A | * | 11/1992 | Sorce .............................. 359/871 |
| 6,361,175 | B1 | * | 3/2002 | Kittelmann et al. .......... 359/851 |
| 7,054,052 | B2 | * | 5/2006 | Niklaus et al. ............... 359/291 |
| 7,292,307 | B2 | * | 11/2007 | Kino .............................. 359/845 |
| 2003/0234991 | A1 | | 12/2003 | Adler et al. |

(Continued)

FOREIGN PATENT DOCUMENTS

| | | |
|---|---|---|
| DE | 102 05 425 A1 | 5/2003 |
| DE | 103 24 796 A1 | 12/2004 |

(Continued)

OTHER PUBLICATIONS

The Design of Parallel Kinematic Machine Tools Using Kinetostatic Performance Criteria, Félix Majou, May 8, 2007.*

(Continued)

*Primary Examiner* — Thomas K Pham
*Assistant Examiner* — Alberto Betancourt
(74) *Attorney, Agent, or Firm* — Fish & Richardson P.C.

(57) ABSTRACT

There is provided a facet mirror device comprising a facet element and a support unit, the support unit supporting the facet element. The support unit comprises a first support element and a second support element, the second support element being connected to the facet element to support the facet element. The first support element is connected to the second support element to support the second support element, the first support element being connected to the second support element via at least one flexure unit, the flexure unit comprising at least one flexure.

29 Claims, 4 Drawing Sheets

(56) References Cited

U.S. PATENT DOCUMENTS

| | | | |
|---|---|---|---|
| 2005/0030653 A1 | 2/2005 | Holderer et al. | |
| 2005/0162762 A1* | 7/2005 | Novak | G02B 26/06 359/849 |
| 2008/0007702 A1* | 1/2008 | Kao | 359/872 |
| 2011/0001945 A1* | 1/2011 | Shiraishi | 359/862 |
| 2012/0044474 A1 | 2/2012 | Hauf et al. | |

FOREIGN PATENT DOCUMENTS

| | | |
|---|---|---|
| JP | H05-83714 U | 11/1993 |
| JP | H 10-206713 A | 8/1998 |
| JP | 2005-517291 A | 6/2005 |
| WO | WO 2008/131930 | 11/2008 |
| WO | WO 2009/100856 | 8/2009 |
| WO | WO 2010/049076 | 5/2010 |

OTHER PUBLICATIONS

Parallel manipulator, Wikipedia, https://en.wikipedia.org/wiki/Parallel_manipulator.*

Definition sets for the Direct Kinematics of Parallel Manipulators, Philippe Wenger, May 7, 2007.*

International Search Report for corresponding PCT Appl No. PCT/EP2011/005938, dated Sep. 22, 2011.

Japanese Office Action, with translation thereof, for JP Appl No. 2014-504177, dated Feb. 17, 2015.

* cited by examiner

FACET MIRROR DEVICE

BACKGROUND OF THE INVENTION

The invention relates to a facet mirror device that may be used within an optical device used in exposure processes, in particular in microlithography systems. It further relates to an optical imaging arrangement comprising such a facet mirror device. It further relates to a method of supporting a facet element of a facet mirror device and a method of manufacturing a facet mirror device. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical element modules comprising optical elements, such as lenses, mirrors, gratings etc., in the light path of the optical system. Those optical elements usually cooperate in an exposure process to illuminate a pattern formed on a mask, reticle or the like and to transfer an image of this pattern onto a substrate such as a wafer. The optical elements are usually combined in one or more functionally distinct optical element groups that may be held within distinct optical element units. Facet mirror devices as the ones mentioned above, among others may serve to homogenize the illumination light beam (illuminating the mask), i.e. to effect a power distribution within the illumination light beam which is as uniform as possible.

Due to the ongoing miniaturization of semiconductor devices there is not only a permanent need for enhanced resolution but also a need for enhanced accuracy of the optical systems used for fabricating those semiconductor devices. This accuracy obviously not only has to be present initially but has to be maintained over the entire operation of the optical system. A particular problem in this context is proper heat removal from the optical components to avoid uneven thermal expansion of these components leading to uneven deformation of these components and, ultimately, to undesired imaging errors.

As a consequence highly sophisticated facet mirror devices have been developed such as they are disclosed, for example, in DE 102 05 425 A1 (Holderer et al.) and DE 103 24 796 A1 (Roβ-Meβemer), the respective entire disclosure of which is incorporated herein by reference.

Both these documents, among others, show facet mirror devices where facet elements with a spherical rear surface sit in an associated recess within a support element. The spherical rear surface rests against a corresponding spherical wall of the support element confining this recess. While such a sphere to sphere interface theoretically may provide a large area of contact with good heat transfer from the facet element to the support element, this large area contact mainly depends on the manufacturing accuracy of both, the facet element and the support element. Furthermore, the spherical recess is rather expensive to manufacture at an accuracy of a few microns or less as it is desirable in many cases in all three directions in space.

To overcome the problem of heat transfer DE 103 24 796 A1 (Roβ-Meβemer) suggests to place a relatively soft coating (e.g. a gold coating) onto one of the spherical surfaces which compensates manufacturing tolerances by deformation. However, despite the low rigidity of this coating, due to the large contact area such deformation requires relatively large forces prone to introduce undesired deformation into the facet element.

Another approach is disclosed in DE 102 05 425 A1 (Holderer et al.) wherein the spherical rear surface of the facet element, more or less in a line contact, rests against a conical wall confining the recess receiving the facet element. This solution, due to the line contact provides a lower heat transfer while still not considerably reducing the manufacturing effort necessary for the conical wall to have the accuracy needed for properly positioning the facet element.

A third approach to support the facet elements is disclosed in DE 102 05 425 A1 (Holderer et al.) wherein the spherical rear surface of the facet element, more or less in a three point contact, rests against three small spheres each located at a free end of a support pin element. Here, the heat transfer is even worse while as well not considerably reducing the manufacturing effort necessary for the three small spheres to have the desired accuracy.

In all three cases outlined above, a manipulating lever is connected to the rear surface of the facet element, corresponding manipulators acting on the manipulating lever to adjust the position and, predominantly, the orientation of the facet element with respect to the support element.

Furthermore, in some cases, the manipulating lever is used for fixing the facet element relative to the support element once it has been adjusted,

SUMMARY OF THE INVENTION

It is thus an object of the invention to, at least to some extent, overcome the above disadvantages and to provide a simple way of supporting a facet element of a facet mirror device at a high accuracy, in particular an accuracy of a few microns or less.

It is a further object of the invention to allow easy adjustment and fixation of the facet element to the desired position and orientation with respect to the support element.

These and other objects are achieved according to the invention which, on the one hand, is based on the teaching that it is possible to provide a simple and reliable, easily adjustable support to the facet element if the facet element is supported via a flexure unit. Such a flexure unit may be easily manufactured while providing proper guidance to the facet element in one or more degrees of freedom allowing easy adjustment of the facet element in these degrees of freedom while reliably and precisely restricting motion in one or more other degrees of freedom.

Thus, according to a first aspect of the invention there is provided a facet mirror device comprising a facet element and a support unit, the support unit supporting the facet element. The support unit comprises a first support element and a second support element, the second support element being connected to the facet element to support the facet element. The first support element is connected to the second support element to support the second support element, the first support element being connected to the second support element via at least one flexure unit, the flexure unit comprising at least one flexure.

According to a second aspect of the invention there is provided an optical imaging arrangement comprising a mask unit adapted to receive a pattern, a substrate unit adapted to receive a substrate, an illumination unit adapted to illuminate the pattern, and an optical projection unit adapted to transfer an image of the pattern onto the substrate. At least one of the illumination unit and the optical projection unit comprises a facet mirror device, the facet mirror device comprising a facet element and a support unit, the support unit supporting the facet element. The support unit comprises a first support element and a second support element, the second support element being connected to the facet element to support the facet element. The first support element is connected to the second support element to support the second support element, the first support element being connected to the second support element via at least one flexure unit, the flexure unit comprising at least one flexure.

According to a third aspect of the invention there is provided a method of supporting a facet element of a facet mirror device comprising providing a facet element and a support element unit and supporting the facet element via the support unit. The support unit comprises a first support element and a second support element, the second support element being connected to the facet element to support the facet element. The first support element is connected to the second support element to support the second support element, the first support element being connected to the second support element via at least one flexure unit, the flexure unit comprising at least one flexure.

According to a fourth aspect of the invention there is provided a method of manufacturing a facet mirror device comprising, in a preparation step, providing a facet element and a support unit, the support unit comprising a first support element and a second support element, the first support element, to support the second support element, being connected to the second support element via at least one flexure unit, the flexure unit comprising at least one flexure; and, in a supporting step, connecting the facet element to the second support element to support the facet element via the support unit.

Further aspects and embodiments of the invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

In the following, a first preferred embodiment of an optical imaging arrangement 101 according to the invention will be described with reference to FIGS. 1 to 3. In order to facilitate the explanations given below an x,y,z-coordinate system has been introduced into the Figures and will be used throughout the following description. In the following, the z-direction designates the vertical direction. However, it will be appreciated that, with other embodiments of the invention, any other orientation in space of this x,y,z-coordinate system and the components of the optical imaging arrangement, respectively, may be chosen.

Figure 1:
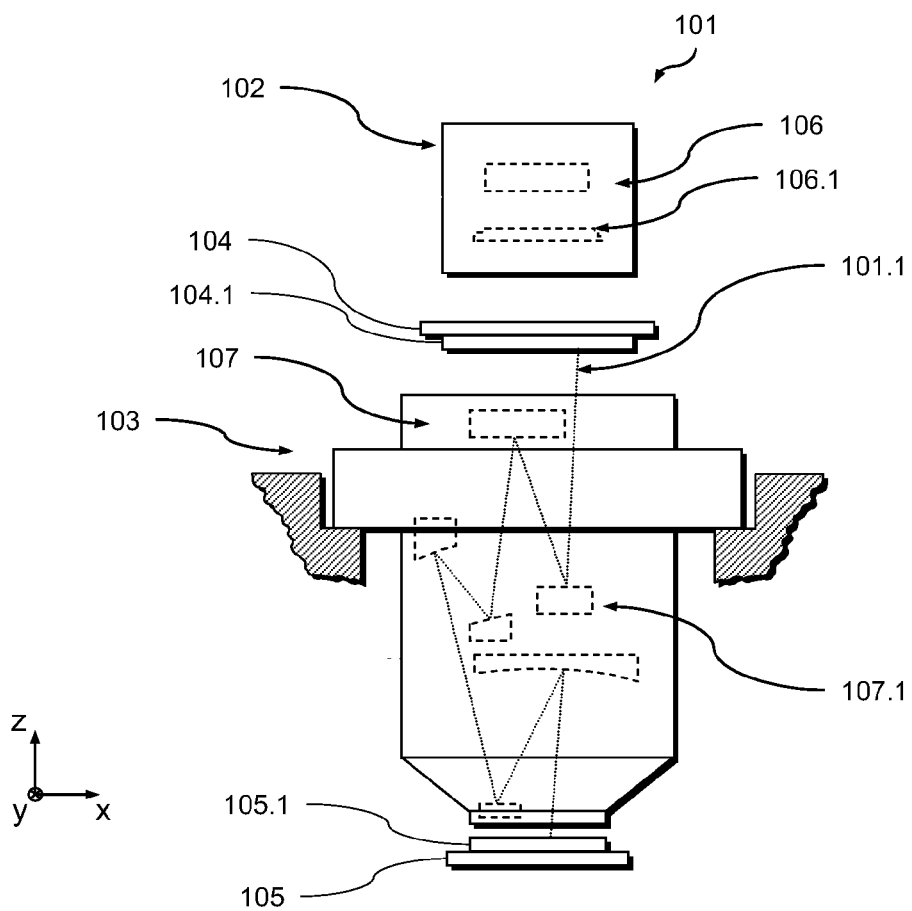
FIG. 1 is a schematic representation of a preferred embodiment of an optical imaging arrangement according to the invention which comprises a preferred embodiment of a facet mirror device according to the invention and with which preferred embodiments of methods according to the invention may be executed.

FIG. 1 is a schematic and not-to-scale representation of the optical imaging arrangement in the form of an optical exposure apparatus 101 used in a microlithography process during manufacture of semiconductor devices. The optical exposure apparatus 101 comprises an illumination unit 102 and an optical projection unit 103 adapted to transfer, in an exposure process, an image of a pattern formed on a mask 104.1 of a mask unit 104 onto a substrate 105.1 of a substrate unit 105. To this end, the illumination unit 102 illuminates the mask 104.1. The optical projection unit 103 receives the light coming from the mask 104.1 and projects the image of the pattern formed on the mask 104.1 onto the substrate 105.1, e.g. a wafer or the like.

The illumination unit 102 comprises an optical element system 106 (only shown in a highly simplified manner in FIG. 1) including a plurality of optical element units such as optical element unit 106.1. As will be explained in further detail below, the optical element unit 106.1 is formed as a preferred embodiment of a facet mirror device according to the invention. The optical projection unit 103 comprises a further optical element system 107 including a plurality of optical element units 107.1. The optical element units of the optical element systems 106 and 107 are aligned along a folded optical axis 101.1 of the optical exposure apparatus 101.

In the embodiment shown, the optical exposure apparatus 101 operates using light in the EUV range at a wavelength between 5 nm to 20 nm, more precisely at a wavelength of 13 nm. Thus, the optical elements used within the illumination unit 102 and the optical projection unit 103 are exclusively reflective optical elements. However, it will be appreciated that, with other embodiments of the invention working at different wavelengths, any type of optical elements (refractive, reflective or diffractive) may be used alone or in an arbitrary combination. The optical element system 107 may comprise a further facet mirror device according to the invention.

Figure 2:
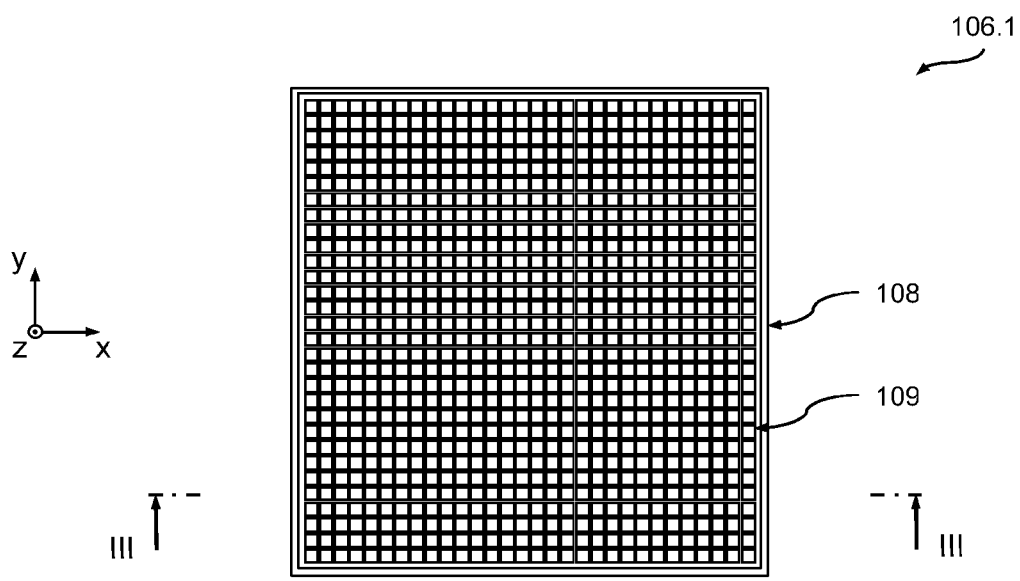
FIG. 2 is a schematic top view of the facet mirror device of FIG. 1.
Figure 3:
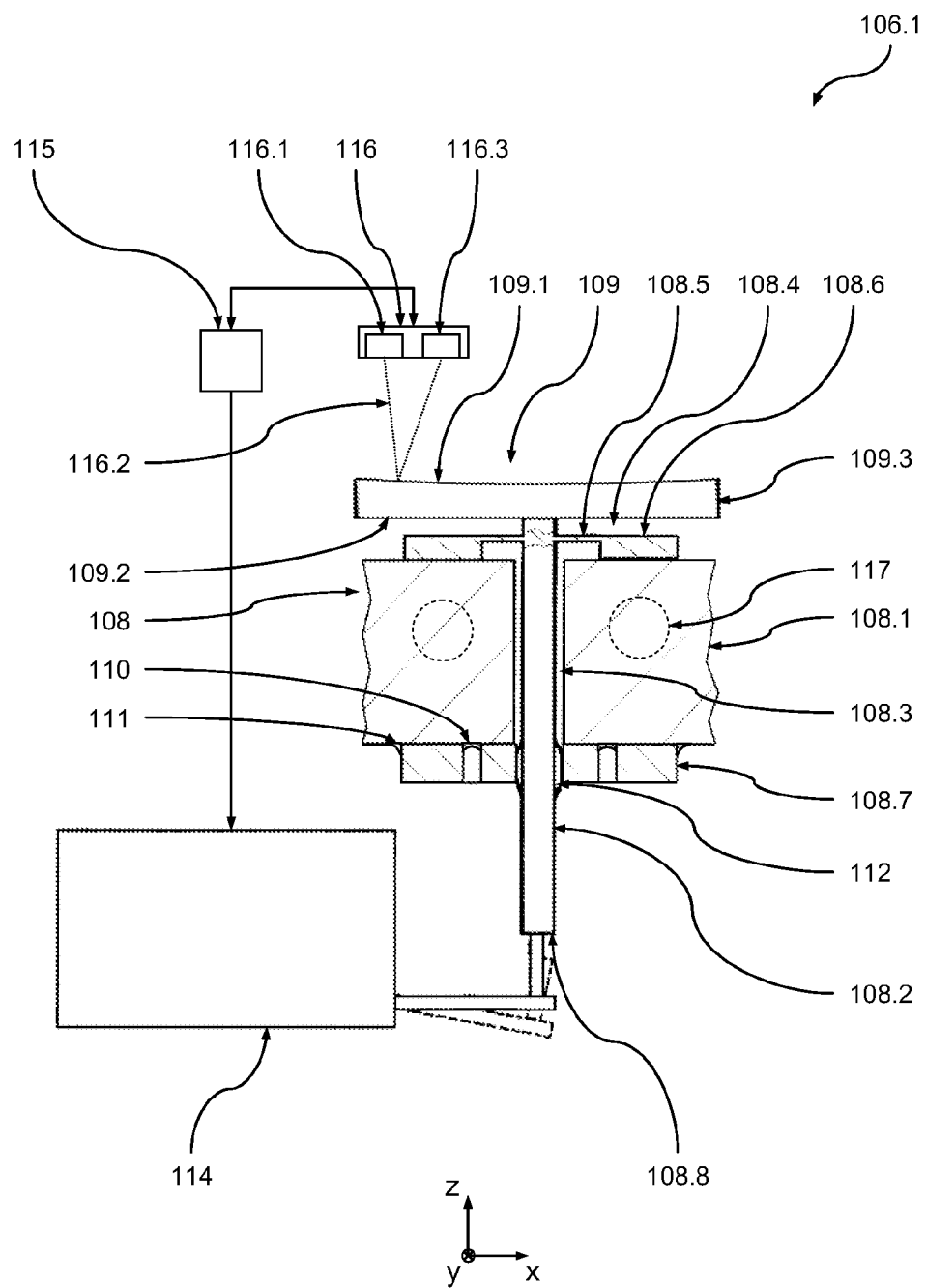
FIG. 3 is a schematic sectional representation of a part of the facet mirror device of FIGS. 1 and 2 (along line of FIG. 2)

As can be seen from FIGS. 2 and 3, the facet mirror device 106.1 comprises a support unit 108 supporting a plurality of facet elements 109 (only one of which is shown in FIG. 3). In the embodiment shown 900 facet elements 109 are supported on the support unit 108. However, it will be appreciated that, with other embodiments of the invention, at any other number of facet elements 109 may be carried by the support unit 108. For example, with certain preferred embodiments of the invention, up to 2000 facet elements 109 or even more are supported on the support unit 108. It should be noted that, preferably, as many facet elements 109 as possible are supported on the support unit 108 to obtain homogenization of the illumination light. Numbers of up to 4000 facet elements 109, more preferably, up to 16000 facet elements 109, may be realized.

In the embodiment shown, the facet elements 109 are arranged such that a small gap of less than 0.05 mm is left between them. Hence, as can be seen in particular from FIG. 2, a regular rectangular matrix of facet elements 109 is formed on the support unit 108 providing a minimum amount of loss in radiant power. However, it will be appreciated that, with other embodiments of the invention, any other arrangement of facet elements may be chosen according to the optical needs of the imaging device, the facet mirror device is used for.

As can be further seen from FIGS. 2 and 3, in particular from FIG. 2, each facet element 109, in a top view (along the z-direction), as an outer contour of substantially rectangular shape, more precisely of substantially squared shape. However, with other embodiments of the invention, any other geometry of this outer contour may be chosen such as, for example, an arbitrarily curved outer contour, a circular outer contour, an elliptic outer contour, a polygonal outer contour or arbitrary combinations thereof.

In the embodiment shown, each facet element has a concave front surface 109.1, a planar rear surface 109.2 and a lateral surface 109.3. The front surface 109.1 is a reflective surface optically used during operation of the optical imaging arrangement 101 in order to provide homogenization of the illumination light provided by the illumination unit 102. The reflective surface 109.1 may be provided via a reflective coating applied to the front surface 109.1 which is adapted to the wavelength of the illumination light used (typically, in order to provide maximum reflectivity at the respective wavelength). With certain embodiments of the invention a reflective grating may be provided at the front surface of the facet elements.

In the embodiment shown, the front surface 109.1 is a spherical surface. However, it will be appreciated that, with other embodiments of the invention, any other shape of the front surface may be chosen depending on the optical task to be performed by the facet mirror device. Hence, apart from such spherical surfaces, aspherical as well as planar surfaces as well as arbitrary combinations thereof may be used. Furthermore, convex front surfaces may also be used.

Furthermore, it should be noted that the optically usable front surface 109.1 of the facet element 109 may be of any suitable size. Preferably, the size of the front surface 109.1 ranges from 10 mm$^2$ to 400 mm$^2$, in particular from 50 mm$^2$ to 150 mm$^2$, more preferably from 90 mm$^2$ to 110 mm$^2$.

The support unit 108 comprises a first support element in the form of a base plate 108.1. Each facet element 109 has an associated second support element 108.2 which, in the embodiment shown, is a substantially pin-shaped body inserted into and reaching through an opening 108.3 within the base plate 108.1. In the embodiment shown, the opening 108.3 is a cylindrical bore. However, any other geometry may be chosen for this recess 108.3 within the base plate 108.1. Furthermore, in the embodiment shown, the base plate 108.1 is a planar element. However, depending e.g. on the optical requirements, an arbitrary geometry (e.g. an at least section wise curved geometry) may be chosen for the base plate.

One end of the second support element 108.2 is connected to the rear side 109.2 of the facet element 109 to support the latter. The second support element 108.2, in turn, is connected to the first support element 108.1 via a flexure unit 108.4 to support the second support element 108.2 and, consequently, the facet element 109 on the first support element 108.1.

The flexure unit 108.4 is located at the front side of the first support element 108.1 facing towards the facet element 109. The flexure unit 108.4 comprises a plurality of flexures in the form of leaf spring elements 108.5 connected at their ends to the second support element 108.2 and a ring-shaped linking section 108.6, respectively.

In the embodiment shown, four leaf spring elements 108.5 are evenly distributed at the circumference of the second support element 108.2. However, it will be appreciated that, with other embodiments of the invention, any other number of leaf spring elements or flexures may be provided. In particular, one single leaf spring element may also be provided connecting the linking section and the second support element in the manner of a continuous membrane extending over substantially the entire circumference of the second support element.

In the embodiment shown, each leaf spring element 108.5, in a top view (along the z-axis) is a substantially rectangular element. The transverse dimension of the leaf spring element 108.5 is selected such that (at the interface with the second support element 108.2) it extends over about 15% of the circumference of the second support element 108.2. However, it will be appreciated that, with other embodiments of the invention, any other suitable shape and dimensions may be selected for the leaf spring elements.

As can be seen from FIG. 3, the leaf spring elements 108.5 are formed monolithic with the second support element 108.2 and the linking section 108.6, while the linking section 108.6 is connected to the first support element 108.1 by any suitable connection (not shown in greater detail) such as a positive connection, a frictional connection, an adhesive connection or arbitrary combinations thereof. However, it will be appreciated that, with other embodiments of the invention, the linking section may also be formed monolithic with the first support element. The same applies the other way round two the connection between the leaf spring elements and the second support element.

The second support element 108.2 protrudes from the rear side of the first support element 108.1 facing away from the facet element 109. Here, in the mounted state (shown in FIG. 3), the first support element 108.1 and the second support element 108.2 are substantially rigidly connected via a connector element in the form of a connector plate 108.7. The connector plate 108.7 is locking the first support element 108.1 and the second support element 108.2 in their mutual relative position and orientation. Hence, the connector plate 108.7 also takes part in supporting the facet element 109.

The connector plate 108.7 is connected to the first support element 108.1 and the second support element 108.2 by any suitable connection such as a positive connection, a frictional connection, an adhesive connection or arbitrary combinations thereof. Preferably, the respective connection is formed by an adhesive connection such as by gluing, soldering or welding as it indicated by the contours 110, 111 and 112.

As will be explained now in greater detail with reference to FIGS. 2 to 4 the facet mirror device 106.1 is manufactured according to a preferred embodiment of the method according to invention using a preferred embodiment of the method of supporting a facet element according to the invention.

Figure 4:
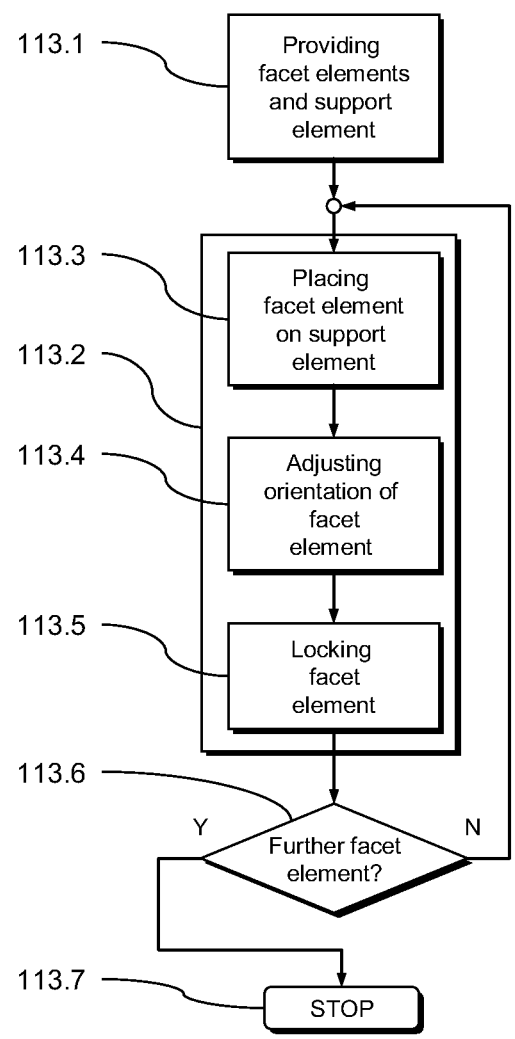
FIG. 4 is a block diagram of a preferred embodiment of a method of manufacturing a facet mirror device comprising a preferred embodiment of a method of supporting the facet element according to the invention which may be used for the optical imaging arrangement of FIG. 1.

According to FIG. 4, in a preparation step 113.1, the components of the support unit 108 and the facet elements 109 are manufactured as it has been outlined above. In the embodiment shown, the facet elements are made of silicon (Si), while the support element is made of silicon carbide (SiC). With such a material pairing and beneficial heat transfer from the facet elements 109 (typically reaching temperatures of 100° C. to 150° C. during operation of the imaging arrangement 101) may be obtained.

However, it will be appreciated that, with other embodiments of the invention, the facet element may be made of silicon carbide (SiC), quartz (SiO$_2$), silicon aluminium (SiAl) Zerodur® (a glass ceramic as manufactured by SCHOTT AG, Mainz, DE), ULE™ (ultra low expansion titanium silicate glass as manufactured by Corning Incorporated, Corning, N.Y. 14831, USA), other glass ceramics as well as copper (Cu) or aluminium (Al) coated with N1P or MoSi layers; while the support element may be made of stainless steel, copper (Cu), aluminium (Al), reaction bonded silicon infiltrated silicon carbide (SiSiC), Zerodur® or other glass ceramics. It should be noted that, preferably, a matching of the coefficient of thermal expansion (CTE) is provided for the facet element and the support element.

Then, in a connecting step 113.3 of a supporting step 113.2, the second support element 108.2 is introduced into the opening 108.3 until the linking section 108.4 rest against the run-on surface of the first support element 108.1. Subsequently, the linking section 108.4 is connected to the first support element 108.1 as it has been outlined above.

Then, the facet element 109 is connected to the second support element 108.2 by any suitable connection (not shown in greater detail) such as a positive connection, a frictional connection, an adhesive connection or arbitrary combinations thereof. However, it will be appreciated that, with other embodiments of intervention, the facet element 109 may be connected to the second support element 108.2 prior to connecting the latter to the first support element 108.1.

Then, in an adjustment step 113.4 of the supporting step 113.2, the position and orientation of the facet element 109 with respect to the first support element 108 is adjusted according to the optical requirements for the facet mirror device 106.1 during later operation in the imaging arrangement 101.

To this end, an adjustment device in the form of a manipulator 114 controlled by a control device 115 is used to generate a corresponding adjustment force on an adjustment interface 108.8 of the second support element 108.2 as it is shown in FIG. 3. Under the control of the control device 115 a relative motion may be generated between the manipulator 114 and the facet mirror device 106.1 is such that the manipulation force F generated may induce the appropriate adjustment motion to provide proper adjustment of the latter.

It will be appreciated that the leaf spring elements 108.5 of the flexure unit 108.4 provide guidance to the second support element 108.2 and facet element 109 by restricting relative motion in two translational degrees of freedom (namely the x- and y-direction) and one rotational degree of freedom (namely rotation about the z-axis) while allowing orientation adjustment in two rotational degrees of freedom (namely rotation about the x- and y-axis) and position adjustment in one translational degree of freedom (namely the z-direction). Hence, in a very simple manner, proper height and inclination adjustment of the facet element 109 may be achieved.

It will be further appreciated that, with certain embodiments of the invention, the manipulator 114 may also be used to adjust the rotation of the facet element 109 (then already mounted to the second support element 108.2) about the z-axis prior to connecting the linking section 108.4 of the second support element 108.2 to the first support element 108.1.

Assessment of the adjustment of the optically used front surface 109.1 is performed using the measurement results of a measurement device 116. In the present embodiment, the measurement device 116 is an optical device comprising an emitter 116.1 emitting a measurement light beam 116.2 towards the front surface 109.1. The measurement light beam 116.2 is reflected at the front surface 109.1 and reaches a sensor 116.3 of the measurement device 116.

In the embodiment shown, the emitter is a conventional emitter using measurement light at a wavelength of 633 nm. Hence, it may be necessary to provide a measurement section at the front surface 109.1 having a reflective coating adapted to this wavelength of the measurement light (provided that the reflective coating of the front surface 109.1 adapted to the exposure light does not provide sufficient reflection at the measurement light wavelength). However, it will be appreciated that, with other embodiments of the invention, other wavelengths may be used for the measurement light, such that, eventually, no such additional measurement section may be necessary.

The signals of the sensor 116.3 are forwarded to the control device 115 which, in turn, performs the assessment of the adjustment of the front surface 109.1 using these signals. It will be appreciated that the control device 115, as a function of the signals of the sensor 116.3, controls the manipulator 114 to provide rapid proper adjustment of the front surface 109.1.

It will be appreciated that, in the embodiment shown, the front surface 109.1 is adjusted at an angular accuracy of less than 100 μrad. However, it will be appreciated that, with other embodiments of the invention, depending on the optical requirements during later operation of the imaging arrangement 101, any other angular accuracy may be chosen.

Once the adjustment of the facet element 109 is completed, in a facet fixation step 113.5 of the supporting step 113.2, the facet element 109 is fixed in place by connecting the connector plate 108.7 to the second support element 108.2 as it has been outlined above.

In the present example, a laser welding technique is used to provide the fixed adhesive connection 112 between the connector plate 108.7 and the second support element 108.2. However, it will be appreciated that, with other embodiments of the invention, apart from the laser welding technique as outlined above, any other suitable bonding technique (such as e.g. fusion bonding, gluing, clamping etc.) may be used alone or in arbitrary combination to provide proper connection and relative fixation between the facet elements and the support unit. Such suitable bonding techniques include, for example, gluing, soldering, laser soldering, welding, diffusion bonding etc.

The connector plate 108.7 had been connected to the first support element 108.1 prior to the adjustment step. However, it will be appreciated that, with other embodiments of the invention, the connection between the connector plate 108.7 and the first support element 108.1 may also be applied at any point in time during or after the adjustment of the facet element as it has been outlined above.

Once the facet fixation step 113.5 is completed, the manipulator 114 disengages the adjustment interface 108.8 of the second support element 108.2 as it is indicated by the dashed contour in FIG. 3.

In a step 113.6 it is then checked if a further facet element 109 is to be mounted to the support element 108. If this is the case the method jumps back to step 113.3 for executing the supporting step for the next facet element 109 to be mounted. Otherwise, the method ends in step 113.7.

Heat removal from the facet mirror device 106.1 during operation of the imaging arrangement 101 may be achieved using a cooling medium circulating through cooling channels as they are indicated by the dashed contours 117 (see FIG. 3).

The connection between the first support element 108.1 and the second support element 208.2 may be made in a sealing manner such that, during operation of the facet mirror device 106.1, the rear side of the base body 108 (facing away from the facet elements 109) may be cooled by a fluid, e.g. a cooling medium, while the space surrounding the facet elements 109 is evacuated (or, depending on the wavelength of the illumination light, eventually filled with a gas). This may be achieved in a particularly simple manner in specific embodiments where one single leaf spring element is provided connecting the linking section and the second support element in the manner of a continuous membrane extending over the entire circumference of the second support element as it has been described above.

In the embodiment shown, the flexure unit comprises flexure is in the form of a leaf spring elements. However, it will be appreciated that, with other embodiments of the invention, other types of flexure is maybe used. For example, instead of a leaf spring element, configuration may be used comprising two elastic hinges each formed at one end of a less flexible section. For example, the leaf springs 108.5 could be replaced by such a configuration, one elastic hinge being formed at the transition to the linking section 108.6 and the other elastic hinge being formed at the transition to the second support element 108.2.

Second Embodiment

Figure 5:
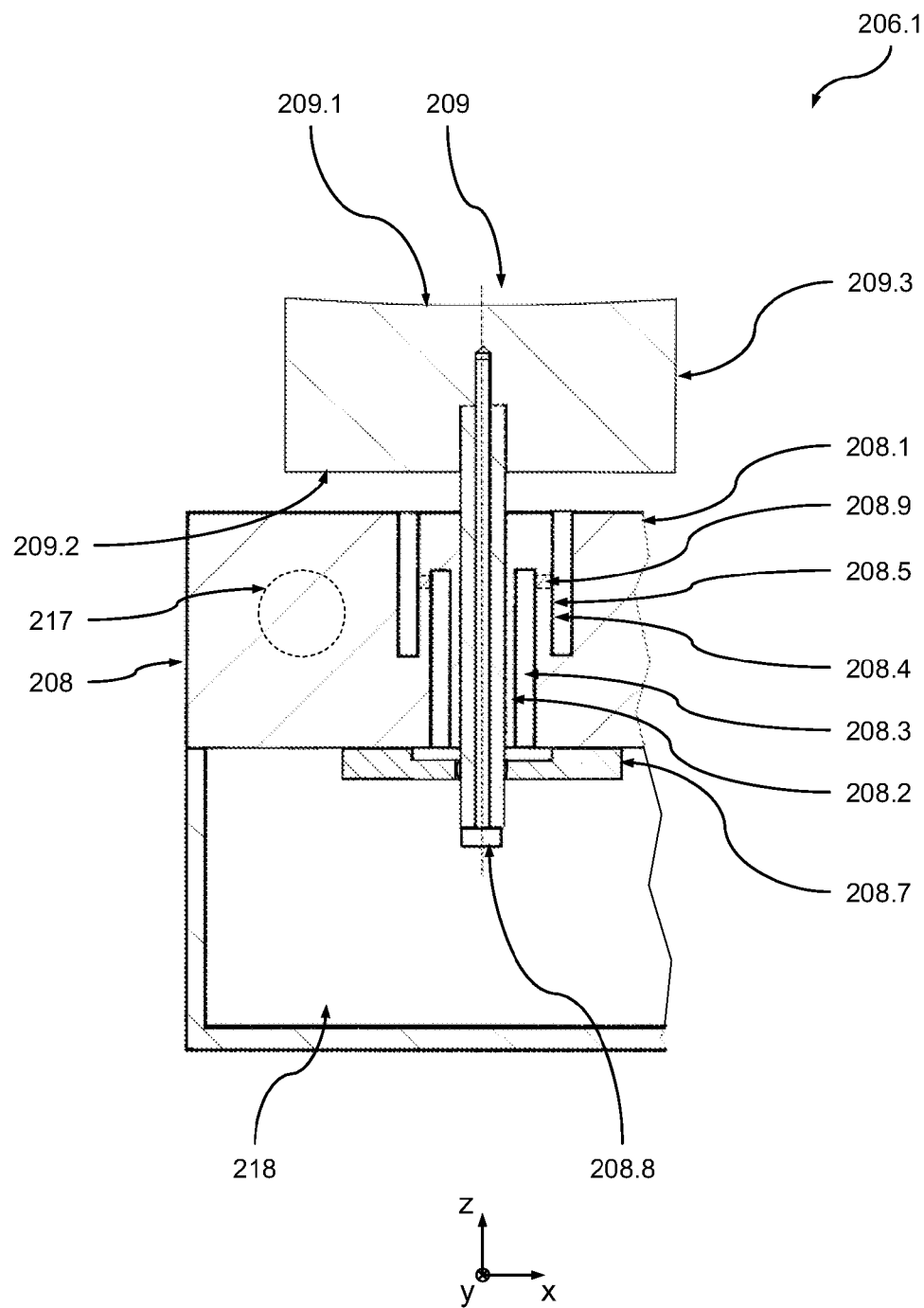
FIG. 5 is a schematic sectional representation of a detail of a further preferred embodiment of a facet mirror device according to the invention.

In the following, a second embodiment of the facet mirror device 206.1 according to the invention will be described with reference to FIG. 5. The facet mirror device 206.1 in its basic design and functionality largely corresponds to the facet mirror device 106.1 and may replace the facet mirror device 106.1 in the optical imaging device 101 of FIG. 1. In particular, the method of supporting a facet element and the method of manufacturing the facet mirror device as they have been described above in relation to the first embodiment (FIG. 4) may be executed as well in the context of this facet mirror device 206.1. Thus, it is here mainly referred to the explanations given above and only the differences with respect to the facet mirror device 106.1 will be explained in further detail. In particular, similar parts are given the same reference numeral raised by the amount 100 and (unless explicitly described in the following) in respect to these parts reference is made to the explanations given above in the context of the first embodiment. For example, elements 209.1, 209.2, 217, 209.3, 208.3 and 208.8 in FIG. 5 correspond to elements 109.1, 109.2, 117, 109.3, 108.3 and 108.8, respectively, in FIG. 3 discussed above.

The only main difference with respect to the facet mirror device 106.1 lies within the design of the flexure unit 208.4. In the embodiment shown, the flexure unit 208.4 is formed by suitable generally ring-shaped slots (connected over certain parts of the circumference of the second support element 208.2 by radial slots) within the base body 208, thereby forming a plurality of (preferably evenly distributed) leaf spring elements 208.5. Elastic hinges 208.9 may be formed at at least one end of the respective leaf spring element 208.5 to facilitate orientation adjustment. It will be appreciated that the flexure unit 208.4 allows motion in two rotational degrees of freedom (namely rotation about the x- and y-axis) while restricting motion in all other four degrees of freedom.

The connection between the connector element 208.7 and the first support element 208.1 and the second support element 208.2 is made in a sealing manner such that a cavity 218 at the rear side of the base body 208 may be filled with a cooling medium while the space surrounding the facet elements 209 is evacuated.

In the foregoing, the invention has been described in the context of embodiments where the optical module according to the invention is used in the illumination unit. However, it will be appreciated that the optical module according to the invention may provide its beneficial effects as well in the optical projection unit.

In the foregoing, the invention has been described in the context of embodiments working in the EUV range. However, it will be appreciated that the invention may also be used at any other wavelength of the exposure light, e.g. in systems working at 193 nm etc.

Finally, in the foregoing, the invention has been described solely in the context of microlithography systems. However, it will be appreciated that the invention may also be used in the context of any other optical device using facet mirror devices.

What is claimed is:

1. A facet mirror device, comprising:
 a facet element; and
 a support unit, comprising:
  a first support element;
  a second support element;
  a flexure unit comprising flexure; and
  a connector element,
 wherein:
  the second support element is connected to the facet element to support the facet element;
  the first support element is connected to the second support element to support the second support element;
  the first support element is connected to the second support element via the flexure unit;
  the first support element is between the flexure unit and the connector element;
  the flexure unit is between the first and second support elements; and
  the first support element is connected to the second support element via the connector.

2. The facet mirror device of claim 1, wherein at least one of the following holds:
 the flexure unit defines a guiding unit configured to guide the facet element in an adjustment motion;
 the flexure unit restricts relative motion between the first and second support elements in at least two degrees of freedom;
 the flexure unit restricts relative motion between the first and second support elements in exactly three degrees of freedom; and
 the flexure unit restricts relative motion between the first and second supports element in two translational degrees of freedom and one rotational degree of freedom.

3. The facet mirror device of claim 1, wherein the flexure unit restricts relative motion between the first and second support elements in two translational degrees of freedom, and the flexure unit comprises a flexure element mainly extending in a plane defined by the two translational degrees of freedom.

4. The facet mirror device of claim 1, wherein the flexure unit comprises at least one member selected from the group consisting of an elastic hinge element, a leaf spring element, and a membrane element.

5. The facet mirror device of claim 1, wherein at least one of the following holds:
 the flexure unit is monolithic with the first support element; and the flexure unit is monolithic with the second support element.

6. The facet mirror device of claim 1, wherein the second support element extends within a recess of the first support element.

7. The facet mirror device of claim 1, further comprising an adjustment device, wherein:
the second support element has an adjustment interface configured to be contacted by the adjustment device; and
at least one of the following holds:
the adjustment device is configured to adjust a relative position between the facet element and the support unit; and
the adjustment device is configured to adjust a relative orientation between the facet element and the support unit.

8. The facet mirror device of claim 1, wherein the first and second support elements are connected together at an interface so that, during operation of the facet mirror device, fluid leakage through the interface between the first and second support elements is prevented.

9. The facet mirror device of claim 1, wherein the second support element extends through an opening within the support element, and the connector element is located at a rear side of the first support element facing away from the facet element.

10. The facet mirror device of claim 1, wherein the connector element is connected via an adhesive bond to at least one member selected from the group consisting of the first support element and the second support element.

11. The facet mirror device of claim 1, wherein the connector element is bonded to at least one member selected from the group consisting of the first support element and the second support element.

12. The facet mirror device of claim 1, wherein at least one of the following holds:
the connector is glued to at least one member selected from the group consisting of the first support element and the second support element;
the connector is soldered to at least one member selected from the group consisting of the first support element and the second support element;
the connector is laser welded to at least one member selected from the group consisting of the first support element and the second support element; and
the connector is diffusion bonded to at least one member selected from the group consisting of the first support element and the second support element.

13. The facet mirror device of claim 1, wherein at least one of the following holds:
the support unit comprises a cooling duct configured to receive a cooling medium during operation of the facet mirror device; and
a cooling cavity is disposed at a rear side of the first support element facing away from the facet element, and the cooling cavity is configured to be filled with a cooling medium.

14. The facet mirror device according to claim 1, wherein at least one of the following holds:
the support unit comprises a plurality of support sections, and each support section is connected to the first support element and supporting a further facet element; and
the support unit supports at least 1000 facet elements.

15. The facet mirror device of claim 1, further comprising an adjustment device, wherein the second support element extends through an opening within the first support element, and an adjustment interface for the adjustment device is formed at a rear end of the second support element facing away from the facet element.

16. The facet mirror device of claim 15, wherein:
the second support element has an adjustment interface configured to be contacted by the adjustment device; and
at least one of the following holds:
the adjustment device is configured to adjust a relative position between the facet element and the support unit; and
the adjustment device is configured to adjust a relative orientation between the facet element and the support unit.

17. The facet mirror device of claim 1, wherein the facet mirror device comprises a plurality of facet elements.

18. An optical imaging arrangement, comprising:
an illumination unit configured to illuminate an object in a first plane; and
an optical projection unit configured to transfer an image of the pattern onto a second plane,
wherein:
at least one unit selected from the group consisting of the illumination unit and the optical projection unit comprises a facet mirror device; and
the facet mirror device comprises:
a facet element; and
a support unit comprising first and second support elements;
a flexure unit comprising a flexure; and
a connector element;
the second support element is connected to the facet element to support the facet element;
the first support element is connected to the second support element to support the second support element;
the first support element is connected to said the support element via the flexure unit;
the first support element is between the flexure unit and the connector element;
the flexure unit is between the first and second support elements; and
the first support element is connected to the second support element via the connector element.

19. The optical imaging arrangement of claim 18, wherein the illumination unit comprises the facet mirror device.

20. The optical imaging arrangement of claim 18, wherein at least one of the following holds:
the flexure unit defines a guiding unit configured to guide the facet element in an adjustment motion;
the flexure unit restricts relative motion between the first and second support elements in at least two degrees of freedom;
the flexure unit restricts relative motion between the first and said second support elements in exactly three degrees of freedom; and
the flexure unit restricts relative motion between the first and second supports element in two translational degrees of freedom and one rotational degree of freedom.

21. The optical imaging arrangement of claim 18, wherein the facet mirror device comprises a plurality of facet elements.

22. A method, comprising:
supporting a facet element of a facet mirror device via a support unit, the support unit comprising first support and second support elements, the second support element being connected to the facet element to support the facet element, the first support element being connected to the second support element to support the second support element, the first support element being connected to the second support element via a flexure unit, the flexure unit comprising a flexure, the first support element being between the flexure unit and the connector element, the flexure unit being between the first and second support elements, and the first support element being connected to the second support element via a connector element which is separate from the flexure unit.

23. The method of claim 22, further comprising at least one of the following:
   during operation of the facet mirror device, performing at least one of the following:
      adjusting a position of the facet element with respect to the support unit according to optical needs; and
      adjusting an orientation of the facet element with respect to the support unit according to optical needs;
   using an adjustment device which contacts an adjustment interface of the second support element to adjust at least one of the following:
      the position of the facet element with respect to the support unit; and
      the orientation of the facet element with respect to the support unit; and
   using the flexure unit to guide the facet element in an adjustment motion to adjust at least one of the following:
      the position of the facet element with respect to the support unit; and
      the orientation of the facet element with respect to the support unit.

24. The method of claim 22, further comprising at least one of the following:
   fixing the facet element to the support unit; and
   connecting the first and second support elements at an interface so that, during operation of the facet mirror device, fluid leakage through the interface between the first and second support elements is prevented.

25. The method of claim 22, wherein the facet mirror device comprises a plurality of facet elements.

26. A facet mirror device, comprising:
   a facet element; and
   a support unit, comprising:
      a first support element;
      a second support element;
      a flexure unit comprising a flexure; and
      a connector element,
   wherein:
      the second support element is connected to the facet element to support the facet element;
      the first support element is connected to the second support element to support the second support element;
      the first support element is connected to the second support element via the flexure unit;
      the first support element is connected to the second support element via the connector element; and
      the flexure unit and the connector element are arranged kinematically in parallel between the first support element and the facet element.

27. The facet mirror device of claim 26, wherein the facet mirror device comprises a plurality of facet elements.

28. A facet mirror device, comprising:
   a facet element;
   a support unit, comprising:
      a first support element;
      a second support element;
      a flexure unit comprising flexure; and
      a connector element, and
   an adjustment device;
   wherein:
      the second support element is connected to the facet element to support the facet element;
      the first support element is connected to the second support element to support the second support element;
      the first support element is connected to the second support element via the flexure unit;
      the first support element is connected to the second support element via the connector;
      the flexure unit is in direct contact with both the first support element and the second support element; and
   wherein at least one of the following holds:
      the second support element has an adjustment interface configured to be contacted by the adjustment device, and the adjustment device is configured to adjust at least one of the following:
         a relative position between the facet element and the support unit; and
         a relative orientation between the facet element and the support unit; and
      the second support element extends through an opening within the first support element, and an adjustment interface for the adjustment device is formed at a rear end of the second support element facing away from the facet element.

29. The facet mirror device of claim 28, wherein the facet mirror device comprises a plurality of facet elements.

* * * * *

UNITED STATES PATENT AND TRADEMARK OFFICE
CERTIFICATE OF CORRECTION

PATENT NO. : 9,645,388 B2  Page 1 of 1
APPLICATION NO. : 14/047192
DATED : May 9, 2017
INVENTOR(S) : Gerhard-Wilhelm Ziegler et al.

It is certified that error appears in the above-identified patent and that said Letters Patent is hereby corrected as shown below:

In the Specification

Column 1, Line 2, under "FACET MIRROR DEVICE", insert:
-- Cross-Reference to Related Applications
The present application is a continuation of, and claims benefit under 35 USC §120 to, international application PCT/EP2011/055938, filed Apr. 14, 2011, the entire disclosure of which is incorporated by reference herein. --.

Column 2, Line 26, delete "adjusted," and insert -- adjusted. --.

Column 3, Line 50, after "line", insert -- III-III --.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*